United States Patent
Sandhu

[11] Patent Number: 6,108,092
[45] Date of Patent: *Aug. 22, 2000

[54] METHOD AND APPARATUS FOR DETECTING THE ENDPOINT IN CHEMICAL-MECHANICAL POLISHING OF SEMICONDUCTOR WAFERS

[75] Inventor: Gurtej Singh Sandhu, Boise, Id.

[73] Assignee: Micron Technology, Inc., Boise, Id.

[ * ] Notice: This patent is subject to a terminal disclaimer.

[21] Appl. No.: 09/328,034

[22] Filed: Jun. 8, 1999

Related U.S. Application Data

[63] Continuation of application No. 08/914,570, Aug. 19, 1997, Pat. No. 5,910,846, which is a continuation of application No. 08/650,087, May 16, 1996, Pat. No. 5,663,797.

[51] Int. Cl.[7] .................................................... G01B 11/06
[52] U.S. Cl. ........................... 356/382; 356/381; 438/16; 438/693; 451/6
[58] Field of Search .................................... 356/381, 382, 356/375; 438/16, 693; 451/5, 6, 8, 41; 437/8, 194, 195, 974; 216/88, 86, 24, 38

[56] References Cited

U.S. PATENT DOCUMENTS

| | | | |
|---|---|---|---|
| 4,975,141 | 12/1990 | Greco et al. | 156/626.1 |
| 5,337,016 | 8/1994 | Lustig et al. | 437/8 |
| 5,413,941 | 5/1995 | Koos et al. | 437/8 |
| 5,433,651 | 7/1995 | Lustig et al. | 451/6 |
| 5,663,797 | 9/1997 | Sandhu | 356/381 |
| 5,910,846 | 6/1999 | Sandhu | 356/381 |

Primary Examiner—Hoa Q. Pham
Attorney, Agent, or Firm—Perkins Coie LLP

[57] ABSTRACT

A method and apparatus for detecting the endpoint of CMP processing on semiconductor wafer in which a lower layer of material with a first reflectivity is positioned under an upper layer of material with a second reflectivity. Initially an endpoint site is selected on the wafer in a critical area where a boundary between the upper and lower layers defines the desired endpoint of the CMP process. The critical area on the wafer is generally determined by analyzing in the circuit design and the polishing characteristics of previously polished test wafers to denote the last points on the wafer from which the upper layer is desirably removed by CMP processing. After an endpoint site is selected, a light beam impinges the polished surface of the wafer and reflects off of the surface of the wafer to a photo-sensor. The photosensor senses the actual intensity of the reflected light beam. The actual intensity of the reflected light beam is compared with an expected intensity to determine whether the upper layer has been adequately removed from the endpoint site. The actual intensity is preferably compared with an expected intensity for light reflected from one of the upper or lower layers, and the endpoint is preferably detected when the actual intensity of the reflected light beam is either substantially the same as the expected intensity for light reflected from the lower layer or substantially different from the expected intensity for light reflected from the upper layer.

27 Claims, 5 Drawing Sheets

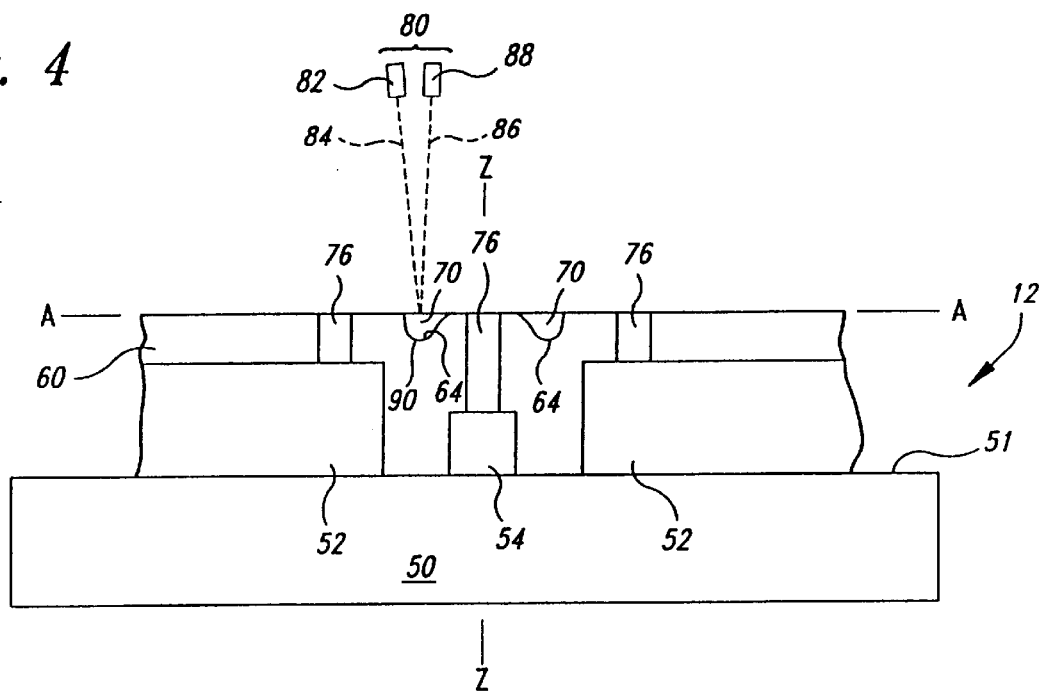
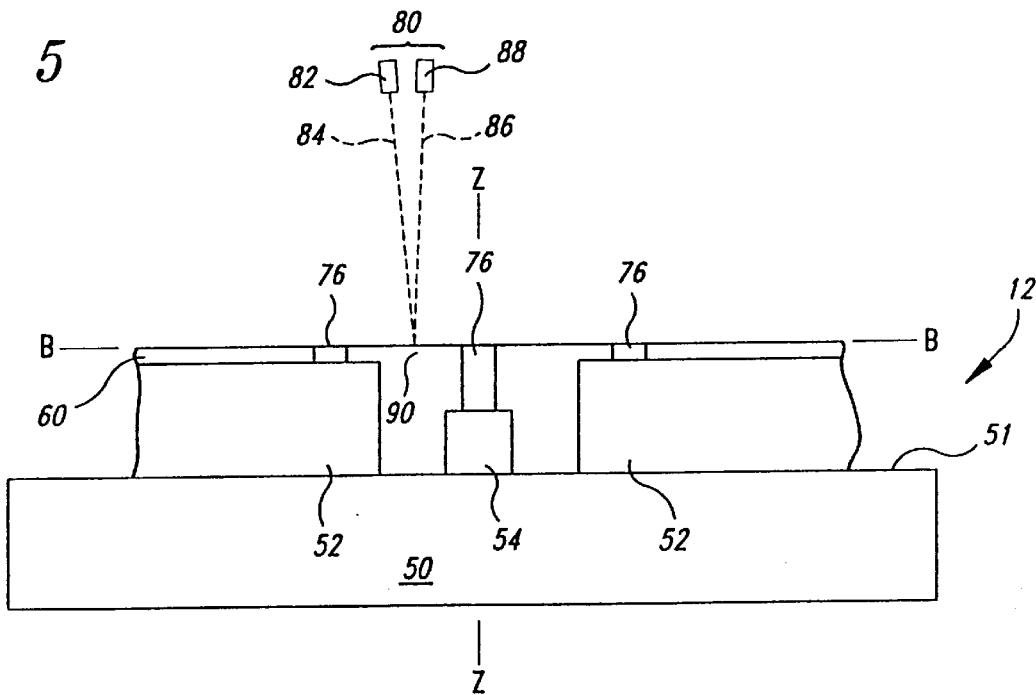

METHOD AND APPARATUS FOR DETECTING THE ENDPOINT IN CHEMICAL-MECHANICAL POLISHING OF SEMICONDUCTOR WAFERS

CROSS-REFERENCE TO RELATED APPLICATIONS

This application is a continuation of U.S. patent application Ser. No. 08/914,570, filed Aug. 19, 1997, U.S. Pat. No. 5,910,846, which is a continuation of U.S. patent application Ser. No. 08/650,087 filed May 16, 1996, U.S. Pat. No. 5,663,797, issued Sep. 2, 1997.

TECHNICAL FIELD

The present invention relates to a method and apparatus for detecting the endpoint in chemical-mechanical polishing of semiconductor wafers; more particularly, the present invention detects the endpoint at critical areas on the wafer where an upper layer of material is not easily removed from the wafer.

BACKGROUND OF THE INVENTION

Chemical-mechanical polishing ("CMP") processes remove material from the surface of the wafer in the production of ultra-high density integrated circuits. In a typical CMP process, a wafer is pressed against a polishing pad in the presence of a slurry under controlled chemical, pressure, velocity, and temperature conditions. The slurry solution generally contains small, abrasive particles that abrade the surface of the wafer, and chemicals that etch and/or oxidize the surface of the wafer. The polishing pad is generally a planar pad made from a continuous phase matrix material such as polyurethane. Thus, when the pad and/or the wafer moves with respect to the other, material is removed from the surface of the wafer by the abrasive particles (mechanical removal) and by the chemicals (chemical removal) in the slurry.

FIG. 1 schematically illustrates the conventional CMP machine 10 with a platen 20, a wafer carrier 30, a polishing pad 40, and a slurry 44 on the polishing pad. An under-pad 25 is typically attached to the upper surface 22 of the platen 20, and the polishing pad 40 is positioned on the under-pad 25. In conventional CMP machines, a drive assembly 26 rotates the platen 20 as indicated by arrow A. In other existing CMP machines, the drive assembly 26 reciprocates the platen 20 back and forth as indicated by arrow B. The motion of the platen 20 is imparted to the pad 40 through the under-pad 25 because the polishing pad 40 frictionally engages the under-pad 25. The wafer carrier 30 has a lower surface 32 to which a wafer 12 may be attached, or the wafer 12 may be attached to a resilient pad 34 positioned between the wafer 12 and the lower surface 32. The wafer carrier 30 may be a weighted, free floating wafer carrier, but an actuator assembly 36 is preferably attached to the wafer carrier 30 to impart axial and rotational motion, as indicated by arrows C and D, respectively.

In the operation of the conventional CMP machine 10, the wafer 12 faces downward against the polishing pad 40, and then the platen 20 and the wafer carrier 30 move relative to one another. As the face of the wafer 12 moves across the planarizing surface 42 of the polishing pad 40, the polishing pad 40 and the slurry 44 remove material from the wafer 12. CMP processes typically remove either conductive materials or insulative materials from the surface of the wafer to produce a flat, uniform surface upon which additional layers of devices may be fabricated.

When a conductive layer is polished from a wafer, the CMP processes must accurately stop polishing the wafer at a desired endpoint. Conductive layers are typically deposited over insulative layers to fill vias or trenches in the insulative layer and form electrical interconnects between device features on the wafer. To electrically isolate the interconnects from one another, it desirable to stop the CMP process below the top of the insulative layer and above the bottom of the conductive material in the vias and trenches. If the CMP process is stopped before the desired endpoint ("under-polishing"), then the interconnects will not be electrically isolated from one another and shorting will occur in the circuit. Conversely, if the CMP process is stopped after the desired endpoint ("over-polishing"), then interconnects may be completely removed from the wafer. Therefore, to avoid serious defects in a wafer, it is highly desirable to stop the CMP process at the desired endpoint.

U.S. Pat. No. 5,433,651 to Lustig et al. discloses an apparatus and a method for determining the endpoint of a CMP process in which a laser beam passes through a window in the polishing pad and impinges upon the polished surface of the wafer. The laser beam scans across the surface of the wafer, and a photosensor senses the intensity of the beam that reflects from the wafer. Conductive materials, such as aluminum, have a reflectivity index of approximately 90%, while insulative materials, such as borophosphate silicon glass ("BPSG"), have a reflectivity index of approximately 35%. At the endpoint of the CMP process, therefore, the intensity of the reflected beam alternates between that of the conductive material and the insulative material as the laser beam scans across the wafer. The Lustig et al. patent discloses that the endpoint of the CMP process is detected when the intensity of the reflected beam changes from that of the conductive material to the average intensity of the conductive and insulative materials.

One problem with the method of determining the endpoint of the CMP process disclosed in the Lustig et al. patent is that it may not accurately detect the endpoint on wafers that have small "critical areas." The critical areas are typically depressions on the surface of the wafer that are the last point on the wafer from which the conductive material is removed by CMP processing. The location and size of the critical areas is a function of the circuit design and the uniformity of the polishing rate across the surface of the wafer. As a result, the critical areas vary from one type of die to another, and they typically occupy a minuscule portion of the wafer surface. The method disclosed in the Lustig et al. patent may not detect the status of the CMP process at many critical areas on the wafer because the critical areas occupy such a small percentage of the wafer's surface that the few reflective signals generated by the critical areas do not statistically impact the overall average reflectivity of the substantially larger number of reflective signals from the interconnects. Thus, even if the Lustig et al. patent recognized the problem of critical areas, it may not accurately detect the endpoint of the CMP process at critical areas on the wafer.

In light of the problems with detecting the endpoint of the CMP process at critical areas on the wafer, it would be desirably to develop a method that quickly and accurately detects the endpoint of CMP processing at predetermined critical areas on a semiconductor wafer.

SUMMARY OF THE INVENTION

The inventive method and apparatus detects the endpoint of CMP processing on semiconductor wafers in which a lower layer of material with a first reflectivity is positioned under an upper layer of material with a second reflectivity. Initially, an endpoint site is selected on the wafer in a critical area where a boundary between the upper and lower layers defines the desired endpoint of the CMP process. The critical area on the wafer is determined by analyzing the circuit design on the dies of the wafer and the polishing characteristics of previously polished test wafers, and preferably denoting the last points on the wafer from which the upper layer is desirably removed by CMP processing. After an endpoint site is selected, a light beam impinges the polished surface of the wafer and reflects off of the surface of the wafer to a photo-sensor. The photosensor senses the actual intensity of the reflected light beam. The actual intensity of the reflected light beam is compared with an expected intensity to determine whether the upper layer has been removed from the wafer at the endpoint site. The actual intensity is preferably compared with an expected intensity for light reflected from one of the upper or lower layers, and the endpoint is preferably detected when the actual intensity of the reflected light beam is either substantially the same as the expected intensity for light reflected from the lower layer or substantially different from the expected intensity for light reflected from the upper layer.

BRIEF DESCRIPTION OF THE DRAWINGS

FIG. 4 is a partial schematic cross-sectional view of the wafer of FIG. 2 at one point of the endpoint detection method in accordance with the invention.

FIG. 5 is a partial schematic cross-sectional view of the wafer of FIG. 2 at another point of the endpoint detection method in accordance with the invention.

DETAILED DESCRIPTION OF THE INVENTION

The present invention is a method and apparatus that detects the endpoint of CMP processing at critical areas on the surface of a semiconductor wafer. An important aspect of the invention is to selectively impinge a light beam at predetermined endpoint sites on the wafer and measure the intensity of the reflected light. Another important aspect of the invention is to select the endpoint sites at critical areas on the wafer that are typically the last points on the wafer from which material of an upper layer is desirably removed by CMP processing. By selectively measuring the intensity of the reflected light beam at endpoint sites in critical areas of the wafer, the method of the invention ensures that the CMP process removes the requisite amount of material from even the most problematic areas on the wafer. Therefore, the endpoint detection method of the invention reduces the number of defects on a wafer caused by over-polishing or under-polishing the wafer at the critical areas. FIGS. 2–5, in which like reference numbers referred to like parts throughout the various figures, illustrate the method of the invention and a semiconductor wafer upon which the method of the invention operates.

Figure 1:
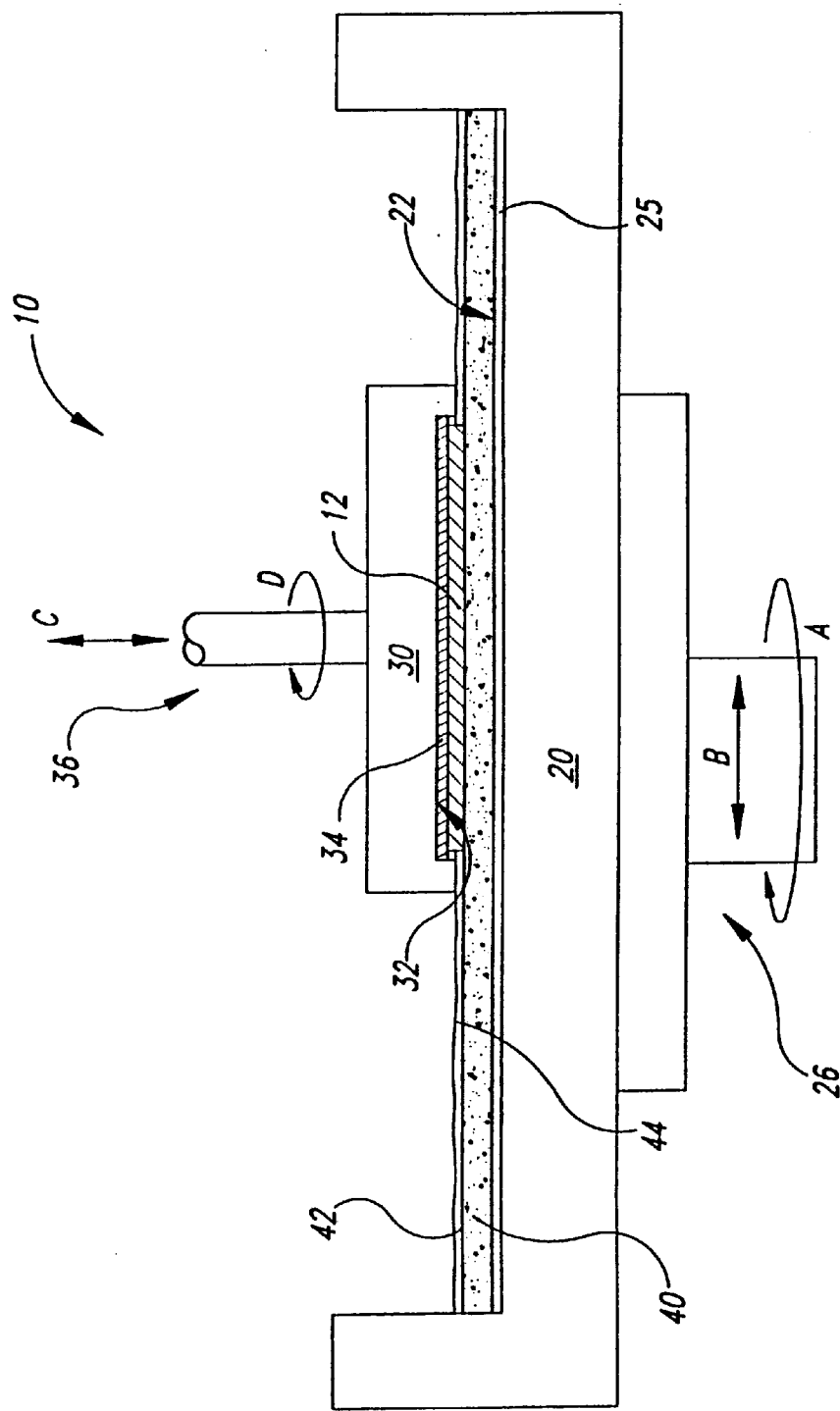
FIG. 1 is a schematic cross-sectional view of a CMP machine in accordance with the prior art.
Figure 2:
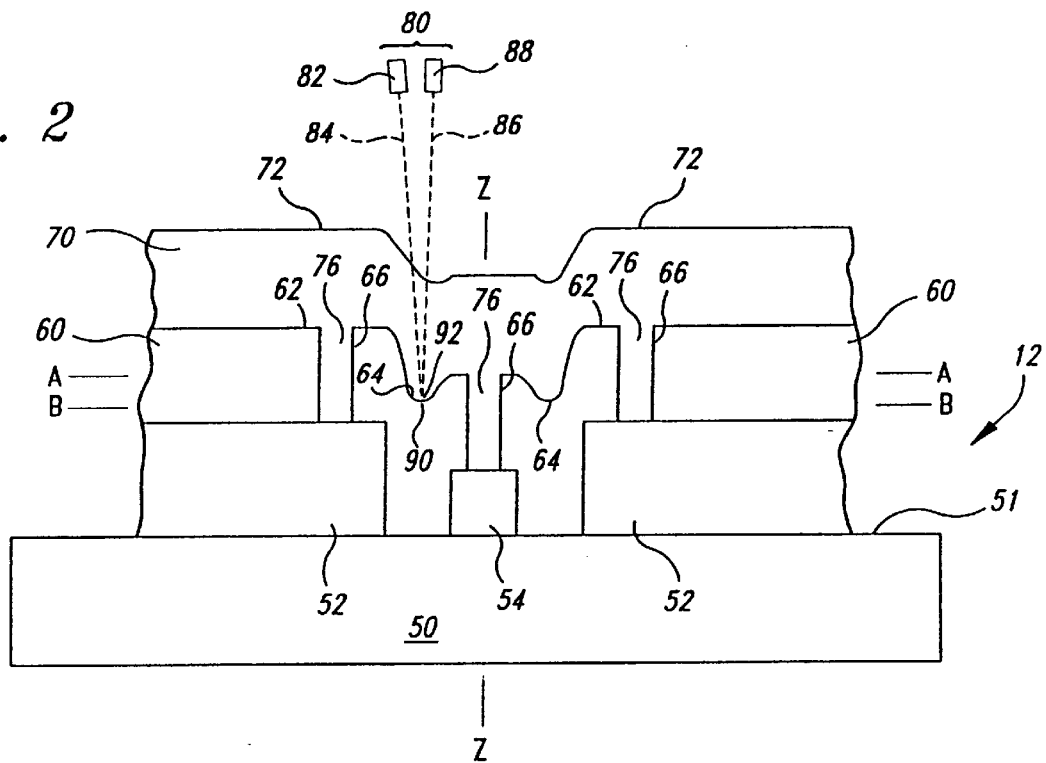
FIG. 2 is a partial schematic cross-sectional view of a wafer upon which the endpoint detection method of the invention operates.

FIG. 2 illustrates a wafer 12 before it has been polished by a CMP machine 10, as discussed above with respect to FIG. 1. The wafer 12 is a typical wafer upon which the method of the invention operates to detect the endpoint of the CMP polishing process, but it will be appreciated that the endpointing method of the invention is not limited to any specific wafer design or circuit design on a wafer. The wafer 12 has a substrate 50, a number of large devices 52 formed on the substrate 50, and a small device 54 formed on the substrate 50 between the large devices 52. The large and small devices 52 and 54 are film stacks that form very small electrical components of the integrated circuits on an individual die of the wafer 12. Depending upon the number of layers in each film stack, the top surfaces of the large and small devices 52 and 54 are generally spaced away from the upper surface 51 of the substrate 50 by different axial distances (as measured with respect to the vertical axis indicated by line Z—Z).

A lower layer 60 is deposited over the substrate 50 and the devices 52 and 54 to provide a platform above the devices 52 and 54 upon which additional devices may be formed. The lower layer 60 generally follows the topography of the substrate 50 and devices 52 and 54 so that the lower layer 60 has high points 62 positioned over the large devices 52 and depressions 64 positioned between the large and small devices 52 and 54. A number of vias 66 etched into the lower layer 60 provide access to the devices 52 and 54 so that other devices (not shown) fabricated on top of the lower layer 60 may be electrically coupled to the devices 52 and 54. The lower layer 60 is generally made from an insulative material such as BPSG, silicon dioxide, silicon nitride, or other known insulative materials. The materials from which the lower layer 60 is made have a first reflectivity, which in the case of BPSG is approximately 0.35.

An upper layer 70 is deposited over the lower layer 60 and into the vias 66 to form interconnects 76 with the device features 52 and 54. The upper layer 70 is generally made from a conductive material that has a second reflectivity, which in the case of aluminum is approximately 0.90. The upper layer 70 generally follows the contour of the lower layer 60 such that the bottom of the upper layer 70 fills the depressions 64 in the lower layer 60.

The depressions 64 define critical areas 92 on the wafer where the material of the upper layer 70 is typically the last portion of the upper layer 70 that is desirably removed from the wafer by CMP processing. All of the conductive material of the upper layer 70 in the depressions 64 must be removed from the wafer to avoid forming unwanted conductive lines across the top of the wafer 12 that may short one device to another and destroy the operation of the circuit. Thus, the critical areas 92 on the wafer 12 are defined by the last desirable portions of the upper layer 70 that are removed from the surface of the wafer 12 by CMP processing.

The location and size of the critical areas 92 is a function of the specific circuit designs, previous planarizing steps in the process flow, and the polishing characteristics at the location of each die on the face of the wafer. The circuit designs often result in depressions or other areas on the surface of the wafer that are either lower than other areas on the wafer or are hard to reach with a polishing pad. In FIG. 2, for example, the bottoms of the depressions 64 are the lowest points on the surface of the lower layer 60. The depressions 64 are also hard to reach with a polishing pad because the top surfaces 62 of the lower layer 60 surround the depressions 64 and support the surface of the polishing (not shown) pad over the depressions 64. Moreover, since the polishing rate may vary across the face of the wafer, one die in the wafer may have a different polishing rate than another die. Therefore, to determine the critical areas 92 for a specific design, it is important to analyze the circuit design and the polishing characteristics to determine the areas on the wafer where the last desirable portion of the upper layer 70 is typically removed from the wafer by CMP processing.

Figure 3:
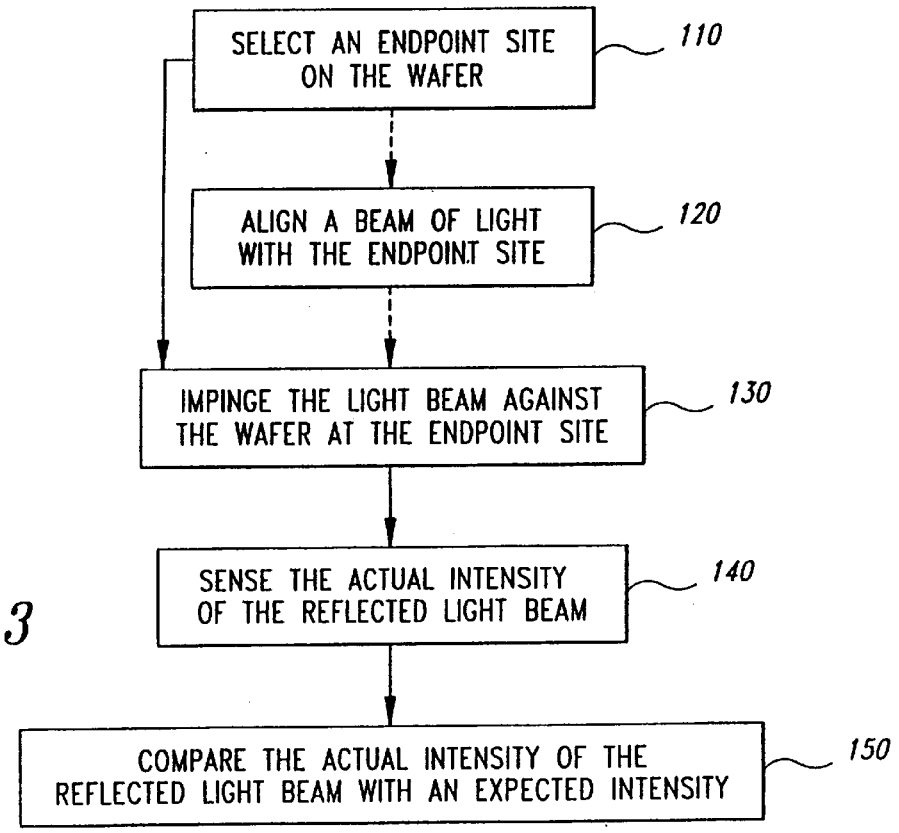
FIG. 3 is a flowchart of an endpoint detection method in accordance with the invention.

FIGS. 2 and 3 together illustrate the operation of the method of the invention. The first step of the method 110 is to select an endpoint site 90 at a critical area 92 in the wafer 12. The endpoint site 90 is preferably located just under the lowest point of the critical area 92 so that all of the conductive material of the upper layer 70 will be removed from the wafer 12 when the endpoint of the CMP process is obtained. The critical areas 92 and the endpoint sites 90 are determined by analyzing the specific circuit structure of the dies on the wafer to estimate the most likely locations of the critical areas, and then polishing several test wafers with the specific circuit structure using the polishing parameters of the selected CMP process. After the test wafers are polished, a laser scans the estimated locations of critical areas to empirically determine the actual locations of critical areas 92 on the wafer 12. Once the location of the critical areas and endpoint sites is ascertained, several endpoint sites on each wafer are preferably selected to ensure the desired endpoint of the CMP process obtained across the whose surface of the wafer.

In a preferred embodiment, the second step 120 of the method of the invention is to align a laser beam with an endpoint site 90 on the wafer 12. In general, a laser 80 with an emitter 82 directs a laser beam 84 to impinge the surface of the wafer 12, and a reflected beam 86 reflects from the surface of the wafer 12 to a photosensor 88. The photosensor 88 senses the intensity of the reflective beam 86, which depends upon whether the laser beam 84 impinges the upper layer 70 or the lower layer 60. The laser beam 84 may be aligned with the endpoint sites 90 by moving either the laser emitter 82 or the wafer 12 to pass the laser beam 84 over the face of the wafer 12. In one embodiment, the laser beam 84 is aligned with the endpoint site 90 by noting the X,Y coordinates of the endpoint site 90 with respect to a reference point on the surface of the wafer, and then moving the wafer to position the X,Y coordinate of the endpoint site in the path of the laser beam 84. In a preferred embodiment, the laser beam is aligned with the endpoint 90 by positioning the wafer 12 using a pattern recognition spectrophotometer, such as the NovaScan 210 manufactured by NOVA Corporation of Israel. In typical pattern recognition spectrophotometers, a laser passes over the circuit to record the pattern of the circuit. The recorded pattern of the circuit is correlated with an actual diagram of the circuit programmed into a pattern recognition module to determine the position of the laser beam 84 with respect to the components of the circuit on the wafer. The laser beam 84 is preferably aligned with the endpoint site 90 to within approximately less than 1.0 μm of the center of the endpoint site. Other suitable spectrophotometers that can appropriately align a laser beam with the endpoint site 90 include spectrophotometers manufactured by Tencor Corporation of California and Thermawave Corporation of California.

After the laser beam 84 is aligned with the endpoint site 90, the next step 130 of the method of the invention is to impinge the laser beam 84 against the wafer 12. In one embodiment, the surface of the wafer is positioned in a clean air environment, and the laser beam 84 passes through the air and directly impinges the surface of the wafer 12. One problem with positioning the surface of the wafer in air, however, is that the surface of the wafer dries out and must be cleaned and wetted to avoid scratches before the wafer may be repolished. Accordingly, in a preferred embodiment, the face of the wafer 12 is placed in water immediately after being removed from the CMP machine, and the laser beam 84 passes through the water to impinge the surface of the wafer. By placing the face of the wafer 12 in water, the wafer may be repolished without cleaning or wetting the wafer. One suitable spectrophotometer that impinges a laser beam against a wafer while the face of the wafer is under water is the NovaScan 210 manufactured by NOVA Corporation.

The next step of the invention 140 is to sense the actual intensity of the reflected light beam 86. A photosensor 88 positioned in the path of the reflected light beam 86 senses the intensity of the reflected light beam as a percentage of the intensity of the original laser beam 84. Different wavelengths of light may be used such that the intensity of the reflected light may be measured at different wavelengths to get a more reliable signature of the material. The intensity of the reflected light beam 86 will depend upon the type of material at the surface of the wafer impinged by the laser beam 84. If the CMP process is stopped such that the polished surface of the wafer is vertically spaced away from the surface 51 of the substrate 50 at a height defined by the line A—A, the intensity of the reflected light beam 86 is theoretically equal to the product of the intensity of the laser beam 84 and the reflectivity index of the upper layer 70. In the case of conductive materials, such as aluminum or tungsten, the reflectivity index is approximately 0.9 such that the intensity of the reflected beam 86 is approximately 90% of the original intensity of the laser beam 84. Similarly, if the CMP process is stopped such that the polished surface of the wafer is vertically spaced away from the surface 51 of the substrate 50 by a height defined by line B—B, the intensity of the reflected light beam 86 is theoretically equal to the product of the intensity of the laser beam 84 and the reflectivity index of the lower layer 60. In the case of BPSG, which has a reflectivity index of approximately 0.35, the intensity of the reflected beam at a height indicated by line B—B is approximately 35% of the original intensity of the laser beam 84. Once again, the NovaScan 210 spectrophotometer suitably detects a change in intensity of the reflected beam 86. Since the endpoint 90 preferably lies in a plane that is just below the lowermost point of the depression 64 (as indicated by line B—B), the expected intensity of the reflected beam 86 at the desired endpoint changes from the theoretical intensity of light reflected from the upper layer 70 to the theoretical intensity of light reflected from the lower layer 60.

The final step 150 of the method is to compare the actual intensity of the reflected light beam 86 with an expected intensity at the endpoint of the CMP process. The expected intensity of the reflected beam at the endpoint of the CMP process is the theoretical intensity of light reflected from either the upper layer 70 or the lower layer 60. In the case where the expected intensity is the theoretical value of light reflected from the upper layer 70, the endpoint is reached when the actual intensity of the reflected beam 86 is substantially different than that of the theoretical intensity of light reflected from the upper layer 70. In the case where the expected intensity is equal to the intensity of light reflected from the lower layer 60, the endpoint is indicated when the actual intensity of the reflected light beam 86 is substantially equal to the theoretical intensity of light reflected from the lower layer 60.

The advantages of the method of the invention are best illustrated in FIGS. 4 and 5. Referring to FIG. 4, the surface of the wafer 12 is under-polished at the level indicated by line A—A because small portions of the upper layer 70 in the depressions 64 remain on the polished surface of the wafer. If the endpoint of the wafer 12 was scanned by a laser in accordance with the Lustig et al. patent, the presence of the critical areas may not be detected because the critical areas occupy only a small percentage of the surface area on the wafer and can generate only few high-reflection signals. Since the Lustig et al. patent treats the high-reflection signals from the critical areas as coming from just another interconnect on the wafer, the relatively few reflective signals from the critical areas will not statistically impact the overall average of the much larger number of reflective signals from the interconnects. Therefore, because the scanning device disclosed in the Lustig et al. patent does not specifically detect the presence of the conductive material at the critical areas, it may falsely indicate that the endpoint of the CMP process has been reached.

The primary advantage of the method of the present invention is that it ensures that the material of the upper layer 70 in the depressions 64 is detected by the laser 80. Since the laser beam 84 is aligned with an endpoint site 90 positioned below the bottom of a critical area 92, the method of the invention ensures that the reflectivity at critical areas on the wafer is adequately measured. Referring to FIGS. 4 and 5 together, the method of the present invention 1 indicates that the CMP process should further planarize the surface of the wafer from the level at line A—A to the level at line B—B. Therefore, the present invention provides a method that accurately detects the endpoint of the CMP process at even the most problematic points on the wafer where the last portions of an upper layer of material are desirably removed from the wafer.

Figure 6:
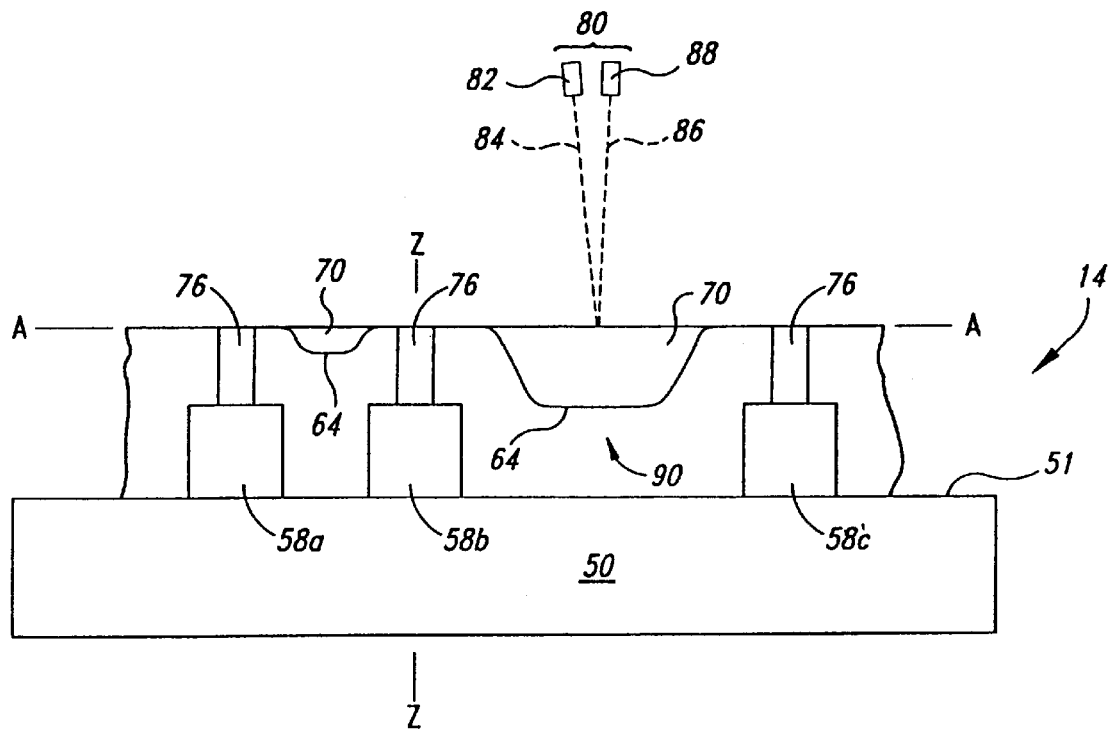
FIG. 6 is a partial schematic cross-sectional view of another wafer upon which the method of the invention operates.

FIG. 6 illustrates another wafer 14 after it has been polished to a level A—A. Wafer 14 has a number of devices 58(a)–(c) asymetrically spaced apart from one another across the substrate 50. The distance between the devices 58(a) and 58(b) produces a small depression 64 in the lower layer 60, while the larger distance between devices 58(b) and 58(c) produces a large, deep depression 64. As with the depressions 64 illustrated in FIGS. 2 and 4, the upper layer 70 fills the depressions 64 and defines another set of critical areas on the wafer 14 from which the upper layer 70 is desirably removed. The method of the invention also detects the endpoint of wafer 14 in the same manner as wafer 12 of FIGS. 2 and 4. Thus, the method of the invention may be used to detect the endpoint on many different wafer structures.

Figure 7:
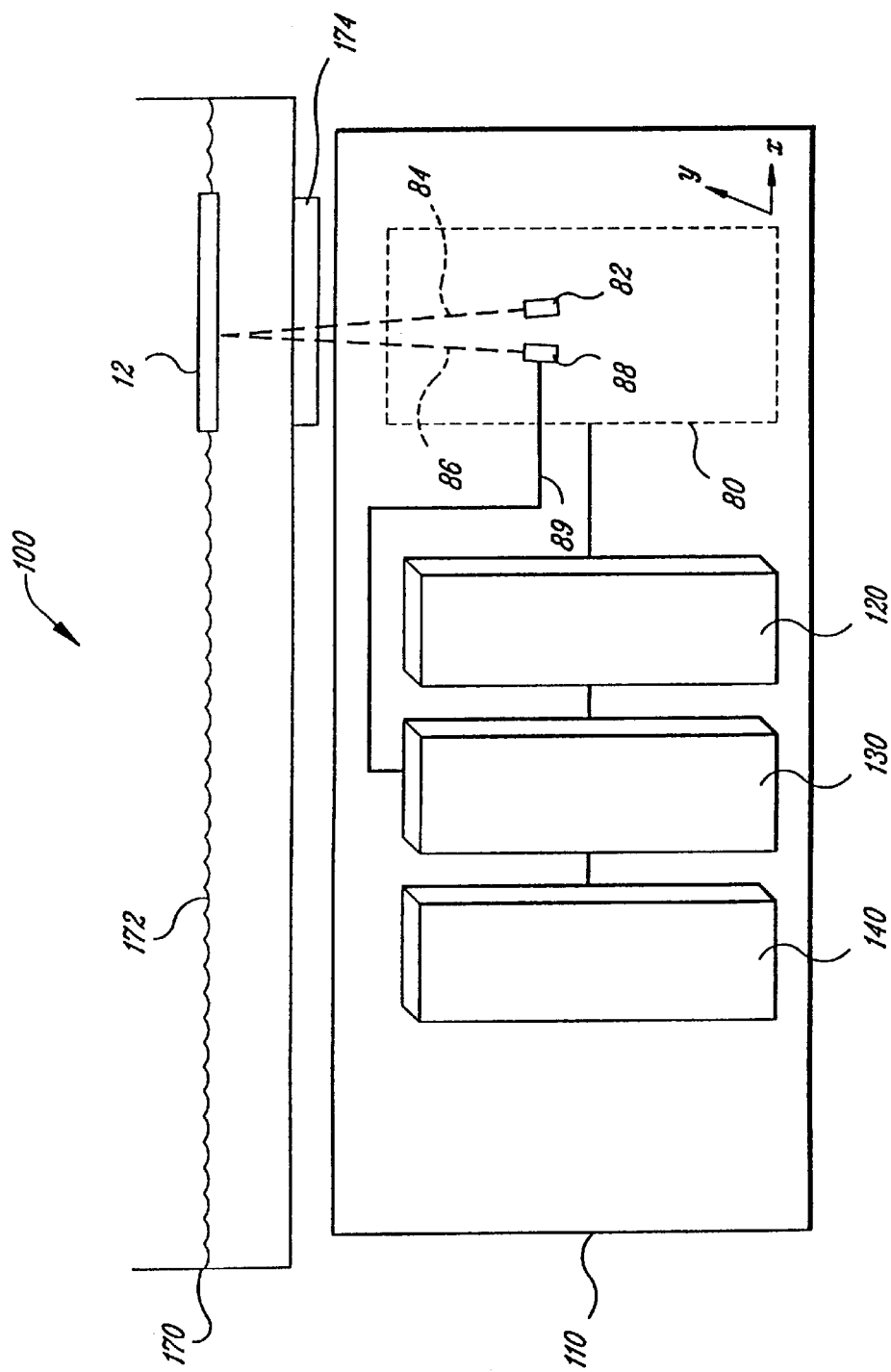
FIG. 7 is a schematic diagram of an endpoint detector in accordance with the invention.

FIG. 7 illustrates an endpoint detector 100 for performing the method of the invention. The endpoint detector 100 has a pattern recognition spectrophotometer 110 for selectively impinging the laser beam 84 at critical areas on the surface of the wafer 12, and a water track 170 in which the wafer 12 positioned. In the pattern recognition spectrophotometer 110, an actuator 120 connected to a laser 80 translates the laser 80 in a plane substantially parallel to the face of the wafer 12, as defined by the X-Y axes. The laser 80, which is described above with respect to FIGS. 2 and 3, has an emitter 82 that directs the laser beam 84 to the wafer 12, and a photosensor 88 for sensing the reflected beam 86 from the wafer 12. A processor/controller 130 is operatively connected to the actuator 120 and to a pattern recognition module 140. Importantly, the pattern recognition module 140 has a database containing the circuit pattern of the specific integrated circuit on the wafer 12 and the locations of the critical areas in the circuit. The processor/controller 130 receives signals from the photosensor 88 via line 89, and it compares the signals from the photosensor 88 with the circuit pattern in the recognition module 140 to determine the location of the laser beam 84 on the face of the wafer 12. One suitable endpoint detector 100 is the NovaScan 210 with a pattern recognition module in which the database contains a circuit pattern of a circuit on the wafer and the location of endpoint sites on the circuit pattern.

In operation, the wafer 12 is mounted in the water track 170 so that the face of the wafer 12 is positioned under the water surface 172 in alignment with an optical window 174 in the bottom of the wafer track 170. The emitter 82 directs the laser beam 84 through the optical window 174 against the wafer 12, and the reflected beam 86 passes back through the optical window 174 to the photosensor 88. As the actuator 120 moves the laser 80 across the wafer, the processor/controller 130 correlates the signals from the photosensor 88 with the circuit pattern programmed in the pattern recognition module 140 to determine the location of the laser beam 84 with respect to the pattern of the circuit on the wafer 12. The processor/controller 130 then directs the actuator 120 to move laser beam 84 across the surface of the wafer 12 until the beam 84 is aligned with a critical location. The photosensor 88 senses the reflectivity of the wafer 12 at the critical area, and it sends a signal representing the reflectivity at the critical area to the processor/controller 130. As described above with respect to the method of the invention, the processor/controller 130 compares the actual reflectivity of the material at the critical area with an expected reflectivity at the endpoint of the CMP process to determine if the wafer is at a desired endpoint.

It will be appreciated that, although specific embodiments of the invention have been described herein for purposes of illustration, various modifications may be made without departing from the spirit and scope of the invention. Accordingly, the invention is not limited except as by the appended claims.

I claim:

1. A method for detecting an endpoint in chemical-mechanical polishing of a semiconductor wafer having a lower layer of material with a first reflectivity and an upper layer with a second reflectivity positioned over the lower layer, wherein the upper layer is polished with a chemical-mechanical polishing process to form a polished surface on the wafer, the method comprising:

selecting an endpoint site on the wafer defined by a boundary between the upper and lower layers at a selected location on a topography of a circuit of the wafer, the selected location being at a depression in the boundary between the upper and lower layers;

impinging a beam of light against the polished surface of the wafer, the beam of light being reflected to a light sensor;

sensing an actual intensity of the reflected beam of light; and comparing the actual intensity of the reflected light beam with an expected intensity.

2. The method of claim 1 wherein when the endpoint is not detected at the comparing step, the method further comprises the step of re-polishing the wafer to form a re-polished surface on the wafer and repeating the impinging, sensing, and comparing steps on the re-polished surface.

3. The method of claim 1 wherein the selecting step comprises choosing multiple endpoint sites on the wafer and performing the impinging, sensing, and comparing steps at each endpoint site.

4. The method of claim 1 wherein the selecting step comprises estimating points on the wafer at which portions of the upper layer are consistently the last parts of the upper layer desirably removed from the wafer before the desired endpoint, and scanning the estimated points on polished test wafers to determine actual points on the wafer at which portions of the upper layer are consistently the last parts of the upper layer desirably removed from the wafer before the desired endpoint.

5. The method of claim 1 wherein the comparing step further comprises comparing the actual intensity of the reflected light beam with an expected intensity for light reflected from one of the upper and lower layers, the endpoint being detected when the actual intensity of the reflected light beam is either substantially the same as the expected intensity for light reflected from the lower layer or substantially different from the expected intensity for light reflected from the upper layer.

6. The method of claim 1 wherein the method further comprises aligning a beam of light with the endpoint site.

7. The method of claim 6 wherein the wafer has a number of dies and each die has a circuit pattern, the aligning step comprising scanning the circuit pattern on each die and positioning the endpoint site in the path of the light beam.

8. The method of claim 1 wherein the upper layer is made from a substantially reflective material, and the lower layer is made from a substantially non-reflective material.

9. The method of claim 8 wherein the upper layer is made from aluminum.

10. The method of claim 9 wherein the upper layer is made from tungsten.

11. The method of claim 1 wherein the polished surface on the wafer is disposed in a fluid during the impinging and sensing steps.

12. A method of chemical-mechanical polishing of a semiconductor wafer, comprising:

positioning a wafer adjacent to a polishing surface of a polishing pad in the presence of a planarizing solution, the wafer having a lower layer of material with a first reflectivity and an upper layer with a second reflectivity positioned over the lower layer;

moving at least one of the wafer and the polishing pad with respect to the other to impart relative motion therebetween, the polishing pad and the planarizing solution removing material from the wafer to produce a polished surface on the wafer;

selecting an endpoint site on the wafer defined by a boundary between the upper and lower layers at a selected location on a topography of a circuit on the wafer, the selected location being at a depression in the boundary between the upper and lower layers;

impinging a beam of light against the polished surface of the wafer, the beam of light being reflected to a light sensor;

sensing an actual intensity of the reflected beam of light; and comparing the actual intensity of the reflected light beam with an expected intensity.

13. The method of claim 12 wherein when the endpoint is not detected at the comparing step, the method further comprises the steps of:

re-positioning the wafer adjacent to the polishing surface of the polishing pad in the presence of the slurry;

moving at least one of the wafer and the polishing pad with respect to the other to impart relative motion therebetween, the polishing pad and slurry removing material from the wafer to produce a re-polished surface on the wafer; and repeating the impinging, sensing, and comparing steps on the re-polished surface.

14. The method of claim 12 wherein the selecting step comprises choosing multiple endpoint sites on the wafer and performing the impinging, sensing, and comparing steps at each endpoint site.

15. The method of claim 12 wherein the selecting step comprises estimating points on the wafer at which portions of the upper layer are consistently the last parts of the upper layer desirably removed from the wafer before the desired endpoint, and scanning the estimated points on polished test wafers to determine actual points on the wafer at which portions of the upper layer are consistently the last parts of the upper layer desirably removed from the wafer before the desired endpoint.

16. The method of claim 12 wherein the comparing step further comprises comparing the actual intensity of the reflected light beam with an expected intensity for light reflected from one of the upper and lower layers.

17. The method of claim 12 wherein the method further comprises aligning the beam of light with the endpoint.

18. The method of claim 12 wherein the upper layer is made from a substantially reflective material, and the lower layer is made from a substantially non-reflective material.

19. The method of claim 18 wherein the upper layer is made from aluminum.

20. The method of claim 18 wherein the upper layer is made from tungsten.

21. The method of claim 12 wherein the polished surface on the wafer is disposed in a fluid during the impinging and sensing steps.

22. An endpoint detector for detecting the endpoint in chemical-mechanical polishing of a semiconductor wafer having a lower layer of material with a first reflectivity and an upper layer with a second reflectivity positioned over the lower layer, wherein the upper layer is polished with a chemical-mechanical polishing process to form a polished surface on the wafer, the detector comprising:

a pattern recognition module having a database containing a circuit pattern of a circuit on the wafer and a location of an endpoint site on the circuit pattern, the endpoint site being defined by a boundary between the upper and lower layers at a selected location on the circuit defined by a depression in the boundary between the upper and lower layers;

a laser having an emitter that directs a laser beam at the wafer and a photosensor that senses an intensity of a reflected beam that reflects from the polished surface of the wafer;

an actuator connected to one of the laser or the wafer, the actuator moving the one of laser or the wafer in a plane substantially parallel to the polished surface of the wafer so that the laser beam passes over the polished surface of the wafer; and a controller operatively coupled to the pattern recognition module, the photosensor, and the one of the laser or the wafer to which the actuator is connected, the controller correlating signals from the photosensor with the circuit pattern in the pattern recognition module to determine where the laser beam impinges the wafer and the controller directing the actuator to move the one of the laser beam or the wafer until the laser beam is aligned with the endpoint site, wherein the photosensor senses the reflectivity of material on the polished surface at the endpoint site and the controller compares the sensed reflectivity at the endpoint site with an expected reflectivity of either the upper or lower layers.

23. The endpoint detector of claim 22, further comprising a water track having an optical window positioned to face the laser, the track being filled with water and the polished surface of the wafer being submerged in the water in alignment with the optical window, wherein the emitter directs the laser beam through the optical window and the water to impinge upon the endpoint site on the polished surface of the wafer.

24. A method for detecting an endpoint in chemical-mechanical polishing of a semiconductor wafer having a lower layer of material with a first reflectivity and an upper layer with a second reflectivity positioned over the lower layer, wherein the upper layer is polished with a chemical-mechanical polishing process to form a polished surface on the wafer, the method comprising:

selecting an endpoint site on the wafer defined by a boundary between the upper and lower layers at a selected location on a topography of a circuit of the wafer, the selected location being at a critical site between the upper and lower layers that is typically a last location on the wafer from which the upper layer is desirably removed;

reflecting a beam of light from the polished surface of the wafer to a light sensor;

sensing an actual intensity of the reflected beam of light; and comparing the actual intensity of the reflected light beam with an expected intensity.

25. A method of chemical-mechanical polishing of a semiconductor wafer, comprising:

positioning a wafer adjacent to a polishing surface of a polishing pad in the presence of a planarizing solution, the wafer having a lower layer of material with a first reflectivity and an upper layer with a second reflectivity positioned over the lower layer;

moving at least one of the wafer and the polishing pad with respect to the other to impart relative motion therebetween, the polishing pad and the planarizing solution removing material from the wafer to produce a polished surface on the wafer;

selecting an endpoint site on the wafer defined by a boundary between the upper and lower layers at a selected location on a topography of a circuit on the wafer, the selected location being at a site between the upper and lower layers that is typically a last location on the wafer from which the upper layer is desirably removed;

reflecting a beam of light from the polished surface of the wafer to a light sensor;

sensing an actual intensity of the reflected beam of light; and comparing the actual intensity of the reflected light beam with an expected intensity.

26. A method for detecting an endpoint in chemical-mechanical polishing of a semiconductor wafer having a lower layer of material with a first reflectivity and an upper layer with a second reflectivity positioned over the lower layer, wherein the upper layer is polished with a chemical-mechanical polishing process to form a polished surface on the wafer, the method comprising:

selecting an endpoint site on the wafer defined by a boundary between the upper and lower layers at a selected location on a topography of a circuit of the wafer, the selected location being defined by a low point of the upper layer that is to be removed from the wafer;

reflecting a beam of light from the polished surface of the wafer to a light sensor;

sensing an actual intensity of the reflected beam of light; and comparing the actual intensity of the reflected light beam with an expected intensity.

27. A method of chemical-mechanical polishing of a semiconductor wafer, comprising:

positioning a wafer adjacent to a polishing surface of a polishing pad in the presence of a planarizing solution, the wafer having a lower layer of material with a first reflectivity and an upper layer with a second reflectivity positioned over the lower layer;

moving at least one of the wafer and the polishing pad with respect to the other to impart relative motion therebetween, the polishing pad and the planarizing solution removing material from the wafer to produce a polished surface on the wafer;

selecting an endpoint site on the wafer defined by a boundary between the upper and lower layers at a selected location on a topography of a circuit on the wafer, the selected location being defined by a low point of the upper layer that is to be removed from the wafer;

reflecting a beam of light from the polished surface of the wafer to a light sensor;

sensing an actual intensity of the reflected beam of light; and comparing the actual intensity of the reflected light beam with an expected intensity.

* * * * *